United States Patent
Geissler et al.

(10) Patent No.: US 8,020,746 B2
(45) Date of Patent: Sep. 20, 2011

(54) METHOD AND DEVICE FOR CONTROLLING THE GENERATION OF ULTRASONIC WIRE BONDS

(75) Inventors: Ute Geissler, Berlin (DE); Herbert Reichl, Berlin (DE); Holger Gaul, Berlin (DE); Klaus-Dieter Lang, Berlin (DE); Martin Schneider-Ramelow, Berlin (DE)

(73) Assignees: Technische Universitaet Berlin, Berlin (DE); Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 12/439,883

(22) PCT Filed: Sep. 4, 2007

(86) PCT No.: PCT/EP2007/059241
§ 371 (c)(1),
(2), (4) Date: Mar. 25, 2009

(87) PCT Pub. No.: WO2008/028906
PCT Pub. Date: Mar. 13, 2008

(65) Prior Publication Data
US 2010/0025453 A1    Feb. 4, 2010

(30) Foreign Application Priority Data
Sep. 5, 2006 (EP) .................... 06018609

(51) Int. Cl.
*B23K 20/10* (2006.01)
*B23K 1/06* (2006.01)
(52) U.S. Cl. ..... 228/110.1; 228/1.1; 228/103; 156/73.1; 156/580.1
(58) Field of Classification Search .......... 228/1.1, 228/110.1, 102, 103; 156/73.1, 580.1
See application file for complete search history.

(56) References Cited

U.S. PATENT DOCUMENTS
3,534,591 A * 10/1970 Phelan .................. 73/634
(Continued)

FOREIGN PATENT DOCUMENTS
DE    45 217    1/1966
(Continued)

OTHER PUBLICATIONS

Mayer et al, "In-Situ Ultrasonic Stress Measurments during Ball Bonding using Integrated Piezoresistive Microsensors", Advacnes in Electronic Packaging, vol. 26-1, 1999, pp. 973-977.*

(Continued)

*Primary Examiner* — Jessica L Ward
*Assistant Examiner* — Devang R Patel
(74) *Attorney, Agent, or Firm* — Maschoff Gilmore & Israelsen

(57) ABSTRACT

A method for generating a wire bond between a wire and an electrical contact member is provided. The method comprising the steps of: pressing a first surface of a portion of the wire against a second surface of the electrical contact member with a first force while vibrating the portion of the wire along the second surface in order to generate a bond; measuring the time dependent vibration amplitude of the portion of the wire at a number of discrete time steps during the generation of the bond; measuring the time dependent deformation of said portion of the wire due to said applied first force and said vibration at a number of discrete time steps during the generation of the bond; and generating a time dependent first signal from at least said vibration amplitude and said deformation at a number of discrete time steps during the generation of the bond that is a direct measure of the stability of the bond at the respective time step.

19 Claims, 4 Drawing Sheets

U.S. PATENT DOCUMENTS

| | | | | |
|---|---|---|---|---|
| 3,890,831 | A | * | 6/1975 | Cusick et al. .................. 73/588 |
| 5,314,105 | A | * | 5/1994 | Farassat ........................ 228/102 |
| 5,431,324 | A | * | 7/1995 | Kajiwara et al. .............. 228/102 |
| 6,279,810 | B1 | | 8/2001 | Chan-Wong et al. |
| 6,929,168 | B2 | * | 8/2005 | Mayer et al. .................. 228/103 |

FOREIGN PATENT DOCUMENTS

| | | |
|---|---|---|
| DE | 2 316 598 | 10/1973 |
| DE | 27 43 018 A1 | 5/1978 |
| DE | 28 23 361 C1 | 12/1979 |
| DE | 29 46 154 A1 | 6/1981 |
| DE | 32 33 629 C2 | 3/1983 |
| DE | 33 33 601 C2 | 3/1984 |
| DE | 32 45 355 A1 | 6/1984 |
| DE | 34 13 859 A1 | 10/1984 |
| DE | 219 338 | 2/1985 |
| DE | 34 29 776 A1 | 2/1986 |
| DE | 35 37 551 C2 | 4/1987 |
| DE | 36 16 651 A1 | 11/1987 |
| DE | 37 01 652 C2 | 8/1988 |
| DE | 37 03 694 A1 | 8/1988 |
| DE | 37 03 694 A1 | 8/1989 |
| DE | 38 05 584 A1 | 8/1989 |
| DE | 38 25 373 A1 | 2/1990 |
| DE | 41 31 565 A1 | 3/1993 |
| DE | 689 02 904 T2 | 3/1993 |
| DE | 43 35 468 A1 | 4/1995 |
| DE | 4447073 C1 | 7/1996 |
| DE | 692 16 761 T2 | 7/1997 |
| DE | 196 18 320 A1 | 11/1997 |
| DE | 198 12 706 A1 | 10/1999 |
| DE | 101 10 048 A1 | 9/2002 |
| DE | 103 49 154 A1 | 5/2004 |
| EP | 0 046 636 B1 | 10/1984 |
| EP | 0 120 746 A1 | 10/1984 |
| EP | 0 208 310 B1 | 1/1987 |
| EP | 0 247 291 A2 | 12/1987 |
| EP | 0 275 877 B1 | 7/1988 |
| EP | 0 368 533 B1 | 5/1990 |
| EP | 0 498 936 B1 | 8/1992 |
| EP | 0 540 189 B1 | 1/1997 |
| EP | 0 945 208 B1 | 9/1999 |
| EP | 0 947 281 B1 | 10/1999 |
| EP | 1 343 201 A1 | 9/2003 |
| EP | 1 625 911 A1 | 2/2006 |
| EP | 0 963 540 B1 | 3/2006 |
| GB | 2 270 868 A | 3/1994 |
| GB | 2 271 306 A | 4/1994 |
| WO | 96/20806 A1 | 7/1996 |
| WO | 02/070185 A1 | 9/2002 |
| WO | WO 02070185 A1 * | 9/2002 |
| WO | 2005/118203 A1 | 12/2005 |

OTHER PUBLICATIONS

Michael Brökelmann et al.: "Bond Process Monitoring via Self-Sensing Piezoelectric Transducers", Frequency Control Symposium and Exposition, 2004, Proceedings of the 2004 IEEE International Montreal, Canada Aug. 23-27, 2004, Piscataway, NJ; USA, IEEE, 23. Aug. 2004, pp. 125-129, XP010784600.

R. Schliesser, et al "Abuschlussbericht zum Verbundprojekt: Lasergestuetztes Sensorsystem zu Online-Prozesskontrolle fuer das US-Bonden von Mikrosystemen (LASOP-MST)" May 1, 1996-Oct. 31, 1999. Translation of relevant sections provided—3.1.9 through 4.4 pp. 53-135.

Frank Osterwald, et al "Verbindungsbildung beim Ultraschall-Drahtbonden—Einfluss der Schwingungsparameter und Modellvorstellungen" Berlin Nov. 16, 1999 Translation of relevant sections provided—3.2 through 3.2.3 pp. 25-29.

Michael Mayer, et al "Thermosonic Ball Bonding Model based on Ultrasonic Friction Power" 2003 Electronics Packaging Technology Conference, pp. 738-743.

* cited by examiner

METHOD AND DEVICE FOR CONTROLLING THE GENERATION OF ULTRASONIC WIRE BONDS

CROSS-REFERENCE TO A RELATED APPLICATION

This application is a National Phase Patent Application of International Patent Application Number PCT/EP2007/059241, filed on Sep. 4, 2007, which claims priority of European Patent Application No. 06018609.5, filed on Sep. 5, 2006.

BACKGROUND

This invention relates to a method and a device for generating wire bonds.

Methods of the aforementioned kind are particularly employed in order to electrically connect electrical contact members (also called pads) of integrated circuits, e.g. microchips, to electrical contact members of substrates of the latter circuits.

Among the most valuable methods for generating these bonds are the so-called ball/wedge bonding and the wedge/wedge bonding methods.

In ball/wedge bonding the wire that is to be bonded with electrical contact members of the microchip (which may be formed integral with the microchip) as well as those of the substrate bearing the microchip, is guided in an elongated hollow shaped tool in form of a capillary.

In a first step a free end portion of the wire protruding from the endface of the tool towards a first electrical contact member of the microchip is melted to form a ball by a hydrogen flame or a discharge of a capacitor. Thereafter the ball is positioned on the first electrical contact member and welded to it by pressing it with a first force (also called bond force) onto the surface of the first electrical contact member, wherein said bond force is normal to said surface, while causing the wire (i.e. the ball) to vibrate with ultrasonic frequency along the surface of the first electrical contact member. In addition heat may be applied to the substrate during the welding procedure (thermosonic bonding).

After having generated the bond between the formerly ball shaped end portion of the wire and the first electrical contact member, the wire is released and the tool is lifted from the surface of the first electrical contact member. Then the tool is moved above a second electrical contact member of the substrate to which the first electrical contact member is to be connected thereby forming a wire loop. Again—by means of the tool—a first surface of a portion of the wire (the wedge) is pressed downwards onto a second surface of the second electrical contact member while said portion of the wire is vibrated at the same time along the second surface with ultrasonic frequency by way of the tool which may comprise a transducer for generating the ultrasonic vibration. After having generated the bond the wire is clamped and torn away, and the next ball shaped end portion of the wire is formed and the process is repeated until the microchip is properly connected to its substrate.

In case welding a ball shaped end portion of the wire to the first electrical contact member of the microchip is substituted by welding a wedge to the microchip's first electrical contact member, the method is called wedge/wedge bonding. In this case positioning of the wedge cannot be accomplished by movements of the tool along the three spatial dimensions x, y, and z, but also needs a rotation about a vertical θ-axis since the wedges have to point in the direction of the wire loops connecting the first electrical contact members to the second electrical contact members.

Wires used in the above methods preferably have a diameter of the order 10 micrometers to 100 micrometers and are typically made from AlSi1, Al and Au. The ultrasonic vibration applied to the wire is of the order 60 kHz to 120 kHz. In principle, standard wires made from AlSi1 having a diameter of 10 to 50 micrometers and so-called thick wires made from Al having a diameter of 100 to 400 micrometer are distinguished, wherein standard wires are bonded within milliseconds and thick wires within several hundred milliseconds.

Formation of a bond evolves in three characteristical stages. In a first stage a close physical contact is established between the portion of the wire and the electrical contact member such that the interaction between the bond partners is governed by van der Waals forces, wherein impurities are transported away from the connection region due to the vibration of the wire in a plane normal to the bond force (cleaning effect), i.e., the friction breaks the impurities—these are $AlO_2$-crystals in case of Al—from the surface, the transport is achieved by the transport power, i.e., the wires bond surface gets deformed which movement transports away the impurities. In a second stage a chemical (metallical) connection is about to form, wherein welded micro regions are distributed statistically. In a third stage diffusion processes into the bulk start. The interfacial area grows while mechanical tensions decrease. The formation of the bond is accelerated due to the mechanical effect of the ultrasonic vibration and the related heat.

In DE 44 47 073 C1 a method for generating a wire bond is described in which a first surface of a portion of the wire is pressed against a second surface of an electrical contact member with a first force normal to the second surface while the portion of the wire is vibrated with ultrasonic frequency along the second surface by means of a suitable tool in order to generate a bond between the portion of the wire and the electrical contact member by welding. According to the method the time dependent deformation of the wire and the time dependent vibration amplitude of the tool along the second surface are measured during generation of the bond and compared separately to corresponding master curves, so as to judge the stability of a generated bond. In case the difference between the respective master curve and the corresponding measured quantity surpasses a predefined tolerance value, the respective bond is considered to be a deficient bond.

SUMMARY

There is a need to provide an improved method and device of the above kind.

In an embodiment of the invention, a method for generating a wire bond between a wire and an electrical contact member is provided which comprises the steps of:
pressing a first surface of a portion of the wire against a second surface of the electrical contact member with a first force being preferably normal to the second surface while vibrating the portion of the wire along the second surface in order to generate a bond,
determining the time dependent envelope of the vibration amplitude associated to the vibration of the portion of the wire along the second surface at a number of discrete time steps during the generation of the bond, measuring the time dependent deformation of said portion of the wire due to said applied first force and said vibration at a number of discrete time steps during the generation of the bond, and generating a time dependent first signal from at least said amplitude and said deformation at a number of discrete time steps during the generation of the bond that is a direct measure of the stability of the bond at the respective time step, wherein the deformation of the wire preferably causes a transfer of impurities away from the location of the forming bond.

The proposed exemplary solution has the benefit of combining both of the measured time dependent quantities—the deformation of the wire as well as the vibration amplitude of the tool—into a single quantity, instead of analysing and evaluating each of the measured quantities alone which is more involved due to a larger amount of data that has to be considered. Most important, analyzing the deformation and the vibration amplitude separately does not allow for distinguishing a vibration amplitude being too large due to a small first force (bond force) from a vibration amplitude being to large due to a small cleaning effect. Hence, controlling the bond force or ultrasonic power of the vibration along the second surface, respectively, during the generation of a bond is in principle impossible, which however is not the case concerning the above solution according to the invention. In addition the solution according to the invention allows for in situ analysis of the measured data, whereas in known methods that determine the vibration amplitude and the wires deformation the data is only evaluated after the bond was generated. In the above measuring a quantity does not necessarily mean to measure the quantity directly but can also mean to measure other quantities that can be used in order to determine the desired quantity.

Exemplary, the fact that the time dependent first signal is a direct measure for the stability of the bond means that the time dependent first signal takes values that are proportional to the stability of the bond at the considered time (or time step). Exemplary, the time dependent first signal is proportional to a force such as a shear force that is necessary to break the bond at a considered time (or time step).

In an exemplary embodiment, an optimal time dependent first signal is determined experimentally before the generation of the bonds, wherein the optimal first signal is considered as a definition of an optimal bond, i.e., at each considered time the optimal first signal takes a value the measured first signal would take during the formation of the bond in case the bond would be an optimal bond. However, different forms of optimal signals are possible, depending on the process that is to be achieved, for example a robust process, a process having a low bond force for sensible microchips, or a process where bonding takes place very fast.

Exemplary, the difference between the optimal first signal and the first signal measured during generation of a bond is determined at least at a number of discrete time steps during generation of the bond. The vibration amplitude of the tool has to be sensed using twice the bond frequency, i.e., 200 kHz which corresponds to 5 microseconds. Preferably measurement is made at a rate of above 1MHz corresponding to distances between data points being smaller than 1 microsecond. For computing the shear force only the envelope of the amplitude modulated vibration is needed, wherein recording a data point each 100 microseconds usually suffices. Concerning the deformation, recording a data point each 0.5 milliseconds suffices In order to optimize the stability (quality) of the bond during generation of the bond at least one control parameter is adjusted during generation of the bond depending on said time dependent difference, i.e., at each considered time step during the formation of the bond the difference can be evaluated and the control parameter can be corrected for accordingly. It is also possible to adjust more than one control parameter at a time.

Exemplary, the at least one control parameter is adjusted so as to decrease, particularly minimize the absolute value of the difference between the optimal first signal and the measured first signal at each considered time step in order to generate a bond that is optimal or at least close to being optimal.

Exemplary the at least one control parameter is adjusted such that a minimum required first signal that is needed in order to form an optimal bond is achieved during generation of the bond. Particularly in case the first signal is given by the shear force, it was found out, that a minimal shear force has to be achieved in order to generate proper (optimal) bonds. This means that the optimal shear force must not be matched perfectly by the measured one, but has to be matched within a certain bound.

Exemplary, the at least one control parameter is one of a vibrational energy per unit time, and a norm and/or direction of the first force.

Alternatively, a period of time during which the vibration is applied to the portion of the wire may be controlled in order to achieve optimal bonds. In this case a time dependent signal characterizing the bonds stability is measured in situ during bonding. Wherein the bonding process is stopped depending on the time evolution of the latter function, i.e., a stopping criterion is employed in order to end the period of time during which ultrasonic energy is applied in order to vibrate the tool. Of course the measured quantity can be the shear force (needed to break the bond at a certain time during the bonding process).

In an exemplary embodiment, the time dependent first signal is equal the minimal shear force (or its derivative with respect to time) that has to be applied to the bond along the second surface of the electrical contact member in order to physically break the bond at a certain time step during generation of the bond. This means, having determined the first signal, one knows the shear stability of the bond which is about to form at each considered time step (for which the shear force is known) during formation of the bond.

Correspondingly, the optimal first signal preferably represents the minimal shear force that has to be applied to an optimal bond in order to physically break the optimal bond at a certain time step during generation of said optimal bond, wherein a generated bond becomes optimal in case a predetermined minimum shear force is reached. Before this occurrence the bond is not an optimal bond, although its evolution in time may be considered as optimal.

In a variant, the vibration amplitude of the portion of the wire is determined by measuring the corresponding vibration amplitude of a tool that is used for transferring said vibration to said portion of the wire and incorporating the elastical deformation of the wire. Apart from vibrating, the tool is adapted to guide the wire and to press it onto the second surface of the electrical contact member. Preferably, the vibration amplitude is measured by means of a laser, wherein the vibration amplitude is preferably measured under a predefined angle with respect to the direction of the first force, i.e., the light beam generated by the laser that is directed to the tool's tip that presses the wire onto the second surface of the electrical contact member, is oriented along a direction that has a component along the direction of the first force or the longitudinal axis of the tool, respectively. Therefore, the vibration amplitude as well as the distance (i.e. the height of the portion of the wire) between the tip (end face) of the tool and the second surface along the direction of the first force is coded into a single signal. Hence, the deformation of the portion of the wire has to be extracted from the vibration amplitude of the tool by means of a filter. In general the deformation may be measured by means of the same laser which also measures the vibration amplitude of the tool in a velocity measuring mode, using an alternative measuring mode this time (measurement of the path).

In a variant, the vibration amplitude of the tool is determined by means of one of an inductive sensor, an acceleration sensor, and a force sensor.

In a further embodiment, a bond is marked in case the difference between the optimal first signal and the first signal being measured in situ during generation of said bond surpasses a predefined value, in order to automatically detect said marked bond among a group of generated bonds. Preferably, the generated bonds are examined in an additional process, wherein those bonds that have been marked are detected and repaired, or destroyed an newly generated.

In another exemplary variant, a frictional energy dissipated per unit time (friction power) due to the interaction between the first surface of the wire and the second surface of the electrical contact member is determined at a number of time steps during generation of the bond for controlling the at least one control parameter. Alternatively, the temperature calculated from said friction power is used to control the at least one control parameter. The frictional energy is determined by measuring (determining) the relative movement between the wire and the pad and the transversal second force.

In a further variant, a time dependent deformation energy for achieving the deformation of the portion of the wire is determined at a number of time steps during generation of said bond from the deformation movement of the wire in order to control the at least one control parameter, i.e., the deformation energy that can be determined from the wire's deformation during generation of a bond, that causes the transfers of oxides away from the bond surface, can be used in order to control the parameters of the bonding process. It is exactly the derivative of the wire's deformation from which the transport power originates.

In yet another exemplary embodiment the frictional energy dissipated per unit time due to the interaction between the first surface of the portion of the wire and the second surface of the electrical contact member is determined at a number of different time steps during formation of said bond in order to determine a temperature dependent parameter characterizing the temperature dependency of the bond generation. Preferably, said parameter is one of a flow stress of the wire, a flow stress of the electrical contact member, an interatomic connection of the wire, or an interatomic connection of the electrical contact member.

In another variant, a second force being exerted by the tool via the portion of the wire on the surface of the electrical contact member is measured at a number of time steps during generation of the bond in order to control the at least one control parameter, wherein the second (transversal) force is oriented along the second surface.

In another embodiment, the invention provides for a device for generating a bond, comprising: a tool for pressing a first surface of a portion of the wire against a second surface of an electrical contact member with a first force normal to the second surface; a vibration generator interacting with said tool in order to vibrate the portion of the wire along the second surface while said portion is pressed against said second surface by means of said tool so as to generate a bond between said wire and said electrical contact member; a first measuring device for measuring a time dependent deformation of said portion of the wire due to said applied first force and said vibration at a number of time steps during the generation of the bond; and a second measuring device for measuring the time dependent vibration amplitude of the portion of the wire at a number of time steps during the generation of the bond, wherein an analysing device is provided that is adapted to generate a time dependent first signal from at least said vibration amplitude and said deformation at a number of time steps during generation of the bond, wherein said first signal is a direct measure of the stability of the bond at the considered time step.

Exemplary, the analysing device is adapted to determine the difference between an optimal first signal determined before the generation of the bond, i.e. before the microchip is connected to its substrate by wire bonding, and the first signal at a number of time steps during generation of the bond, wherein the optimal first signal defines the optimal bond at each time step during generation of said (fictitious) optimal bond, wherein the analysing device is preferably adapted to adjust at least one first control parameter during generation of the bond depending on said time dependent difference.

In an exemplary variant, the analysing device comprises a PID controller that is adapted to adjust at least one control parameter during generation of the bond so as to decrease the absolute of the difference during generation of the bond.

Such PID (proportional-integral-derivative) controllers are well known in standard control theory. By means of the PID controller (or loop), correction to the control parameter such as the ultrasonic power applied for vibrating the tool is calculated from the difference (also denoted as error in control theory) between the optimal first signal determined in beforehand by way of experiments or theory and the first signal measured during generation of the bond in three ways: the current difference is cancelled out directly (proportional), e.g., by multiplying the difference with a (negative) constant that is added to the respective control parameter; the amount of time the difference has continued uncorrected is corrected for by means of integration, i.e., the difference is integrated (added up) over a period of time, and then multiplied by a (negative) constant, and added to the respective control parameter; and the future difference is anticipated from the rate of change of the difference over time (derivative), wherein the first derivative (the slope of the difference) overtime is calculated, and multiplied by another (negative) constant, and also added to the controlled quantity. The derivative term controls the response to a change in the system.

Exemplary, the analysing device is adapted to determine the shear force as the time dependent first signal from at least said time dependent vibration amplitude and said time dependent deformation of the wire at a number of discrete time steps during generation of the bond, wherein the shear force at a respective time step represents the minimal shear force that has to be applied to the bond in order to physically break the bond at a considered time step during generation of the bond. Correspondingly, the optimal first signal represents the minimal shear force that has to be applied to an optimal bond in order to physically break the optimal bond at a certain time step during generation of said optimal bond. Of course, the slopes of the above time dependent quantities can be considered as well.

BRIEF DESCRIPTION OF THE DRAWINGS

The invention is explained in more detail below with regard to exemplary embodiments illustrated in the figures, in which.

DETAILED DESCRIPTION

Figure 1:
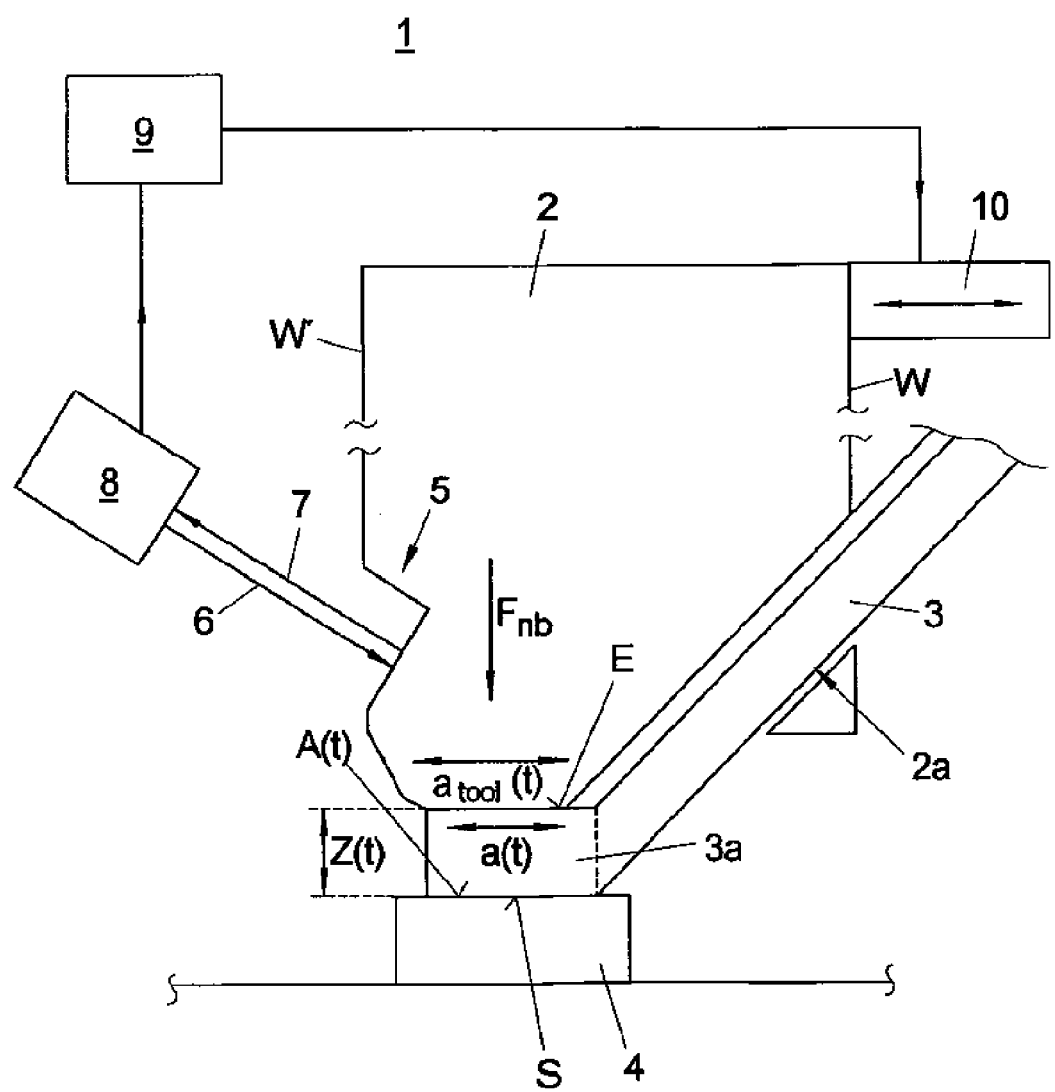
FIG. 1 shows a schematic, partly cross-sectional view of a device for generating wire bonds.

FIG. 1 shows a schematical, partly cross-sectional view of a device 1 for generating an arbitrary number of bonds between a portion 3a of a wire 3, which has a diameter of approximately 25 micrometers, and pad like electrical contact members 4. In the following the bonding process is exemplarily set forth for a single generation of a bond. The portion 3a of the wire 3 that is to be bonded with the electrical contact member 4 is guided to the position of the electrical contact member 4—also called pad—by means of tool 2 having the form of an elongated bar, wherein the wire 3 is guided in a recess 2a of the tool 2 which connects an end face E of the tool 2 with a side wall W of the tool running perpendicular to said end face E.

Once said portion 3a is positioned above the pad 4 the tool 2 is controlled such that it presses a first surface A(t) of the portion 3a, which is the so-called bond surface of the portion 3a, with a first force $F_{nb}$—also called bond force—against a planar second surface S of the pad 4, wherein the bond force $F_{nb}$ is oriented normally with respect to the surface S of the pad 4. The first force $F_{nb}$ for pressing the wire 3 against the pad 4 is exerted by an end face E of a tip of the tool 2 onto a side of the said portion 3a facing away from the bond surface A(t), wherein the end face E extends in a plane running parallel to the second surface S. Initially, the portion 3a of the wire 3 a has the shape of a cylinder wherein the cylinder axis is oriented parallel to the surface S, i.e., in the very beginning of the bonding process the portion 3a can be thought of as a section of a cylinder lying on the pad 4.

In addition, while pressing the portion 3a of the wire 3 against the pad 4, the tool 2 is made to vibrate along a direction running perpendicular to the bond force $F_{nb}$, i.e., along the second surface S of the pad 4. This vibration, which preferably is of ultrasonic frequency, is generated by a transducer 10 (ultrasonic generator) that is coupled to an end portion of the tool 2 facing the tool's 2 tip along the direction of the first force $F_{nb}$.

Due to the applied bond force $F_{nb}$ and vibration, the portion 3a of the wire 3 is deformed which means that a height z(t) of said portion 3a normal to the second surface S decreases with bond time t (also denoted as $t_{bond}$), which is the time that lapses during generation of the bond, while at the same time the bond surface A(t) increases with time. Knowing the (constant) volume $V_0$ of the portion 3a, the bond surface A(t) can be automatically determined at each time by measuring the height z(t). This is done by means of a measuring device 8 that comprises a laser interferometer, i.e., a (stationary) incident light beam 6 is directed to the tool 2 under an angle that is smaller than 90° with respect to the longitudinal axis of the tool 2 (being normal to the second surface S) such that the direction of the incident light beam 6 has a component along the longitudinal axis of the tool 2. Hence, the height z(t), i.e., the distance between the second surface S and the end face E of the tool 2, can be measured by comparing the incident light beam 6 to the light beam 7 reflected from the tool 2. However, for a simple design of the measuring device 8 one has to guarantee that the reflected light beam 7 is oriented parallel with respect to the incident light beam 6. This can be accomplished by designing a region 5 of a side wall W' along the longitudinal axis of the tool 2 such that the incident light beam 6 hits a surface of said region 5 (e.g. a groove) normal to said surface. Of course, it is also possible to measure both quantities separately. For instance the deformation of the wire can be measured by measuring the distance between the tip of the tool and the pad by means of a photo diode or an inductive sensor (distance between two coils).

Since the direction of the incident light beam 6 also has a component lying in the plane of extent of the second surface S, along which the tip of the tool 2 vibrates, the corresponding vibration amplitude $a_{tool}(t)$ of the tool 2 can be determined by means of the measuring device 8 as well. This means that the measuring device 8 generates a single time dependent signal containing both of the time dependent quantities to be measured: the deformation z(t) of the wire 3 and the vibration amplitude $a_{tool}(t)$. The respective quantity can be extracted from said combined time dependent signal by means of a suitable filter.

In order to control the generation of the bond both of the time dependent functions, the deformation z(t) of the wire 3 and the vibration amplitude $a_{tool}(t)$ of the tool 2 are evaluated by means of an analyzing device 9 coupled to the measuring device 8 for determining a time dependent first signal which is the shear force $F_s(t)$ (or its derivative with respect to time) representing the minimal shear force that has to be applied at a time $t_{bond}$ (the actual measurement of time dependent quantities during generation of the bond may be conducted at a number of successive, discrete time steps) to the (developing) bond in order to break the bond at the respective time $t_{bond}$. The direction of the shear force lies within the plane of extent of the bond surface A(t).

This time dependent first signal (shear force $F_s(t)$) is compared during formation of the bond by means of the analyzing device 9 to an optimal first signal which is the time dependent shear force that has to be applied at a time tbond during generation of the bond to break a (developing) fictitious bond that was found to be an optimal bond in before hand.

In order to generate bonds according to a predefined quality standard, control parameters of the bond generation like the vibrational energy per unit time of the transducer 10 that vibrates the tool 2 and thus causes the vibration amplitude $a_{tool}(t)$ of the tool 2, the period of time during which the vibration is applied to the portion 3a of the wire 3, and the norm and/or direction of the first force (bond force) $F_{nb}$, are adjusted by means of a PID controller 11 (as an element of the analyzing device 9, cf. FIG. 2) such that the difference between the measured shear force $F_s(t)$ (actual value) and the optimal shear force $F_{s,opt}(t)$ (target value) vanishes.

The shear force $F_s$ can be inferred from the relation $F_s(t) = \gamma(t)A(t)\sigma_s$, wherein $A(t) = V_0/z(t)$ is the time dependent bond surface, and $\gamma(t)$ is the fraction of the bond surface A(t) that is connected to the second surface of the pad 4 at a time $t_{bond}$ during formation of the bond.

In order to determine $\gamma(t)$ the relation $\gamma(t)[K(t)+A'(t)]+\gamma'(t)-K(t)=0$ is utilized, wherein $K(t)$ is given by the equation $K(t)=\mu_{ox}F_{nb}(4 \cdot f \cdot a(t) \cdot \beta_r+V_0*z'(t)/(z^2(t)*I_{tool}))\beta_t)/A(t)$ and $a(t)$—the relative movement of the portion $3a$ of the wire $3$ with respect to the pad $4$—can be determined from the expression $a(t)=a_{tool}(t)-[D_{pad}+z^2(t)/(G*V_0)]F_t(t)$. In the above expression $I_{tool}$ denotes the length of the wedge, i.e., the length of the portion $3a$ along the second surface.

In these relations $\beta_r(t)$ and $\beta_t(t)$ are proportional constants, $D_{pad}$ is the spring constant of the pad $4$, $G$ is the shear module of the wire $3$, $F_t(t)$ is the (transversal) second force, $f$ is the ultrasonic frequency, $\sigma_s$ is the shear resistance of the bond, and $\mu_{ox}$ is the oxide friction number determining the friction between the wire $3$ and the pad $4$.

Crucial to the determination of the shear force $F_s(t)$ are the terms $z'(t)\beta_t$ and $z^2(t)F_t(t)/(G*V_0)$, indicating that the vibration amplitude $a_{tool}(t)$ and the deformation (height) $z(t)$ of the wire $3$ have to be considered in conjunction in order to be able to guarantee a thorough controlling of the bonding process.

Having the above relations at hand, one has to conduct the following measurements prior to the bond generating/controlling process:

The shear force $F_s(t)$, the height $z(t)$ and the envelope of tool's vibration amplitude $a_{tool}(t)$ have to be measured at different times $t$ (also denoted as $t_{bond}$) during generation of the bond for different values of the bond force $F_{nb}$ and the ultrasonic power used to vibrate the tool $2$ and wire $3$. Eventually, also the pull-off force, i.e., the force necessary to pull the wire $3$ off the second surface $S$ of the pad $4$ in a direction normal to the second surface $S$ may be employed in order to select a master curve $F_s$, i.e. the optimal shear Force $F_{s,opt}(t)$, from a variety of different possible shear forces $F_s$.

From the deformation (height) $z(t)$ of the wire $3$, the vibration amplitude $a_{tool}(t)$ and the target course of the shear force $F_s$, i.e. the optimal shear force $F_{s,opt}(t)$, is determined. Alternatively, the slope of the optimal shear force can be employed as a master curve as well. The coefficients $\sigma_s$, $b_r(t)$, and $b_t(t)$ are determined from measurements, too; the constants $\mu_{ox}$ and $G$ are inferred from the literature or experiments. For determining the transversal Force $F_t(t)$, the vibration amplitude $a_0(t)$ of the tool $2$ in case of zero load of the tool $2$ has to be measured in beforehand, too (i.e., at zero bond force $F_{nb}$).

From the above quantities and parameters the shear force $F_s(t)$ can be measured in situ, and by comparing it to the reference (optimal) shear force $F_{s,opt}(t)$, at least one control parameter like the ultrasonic power can be adjusted so as to yield a shear force $F_s(t)$ during the bond generation that is in accord with the reference shear force $F_{s,opt}(t)$.

Figure 2:
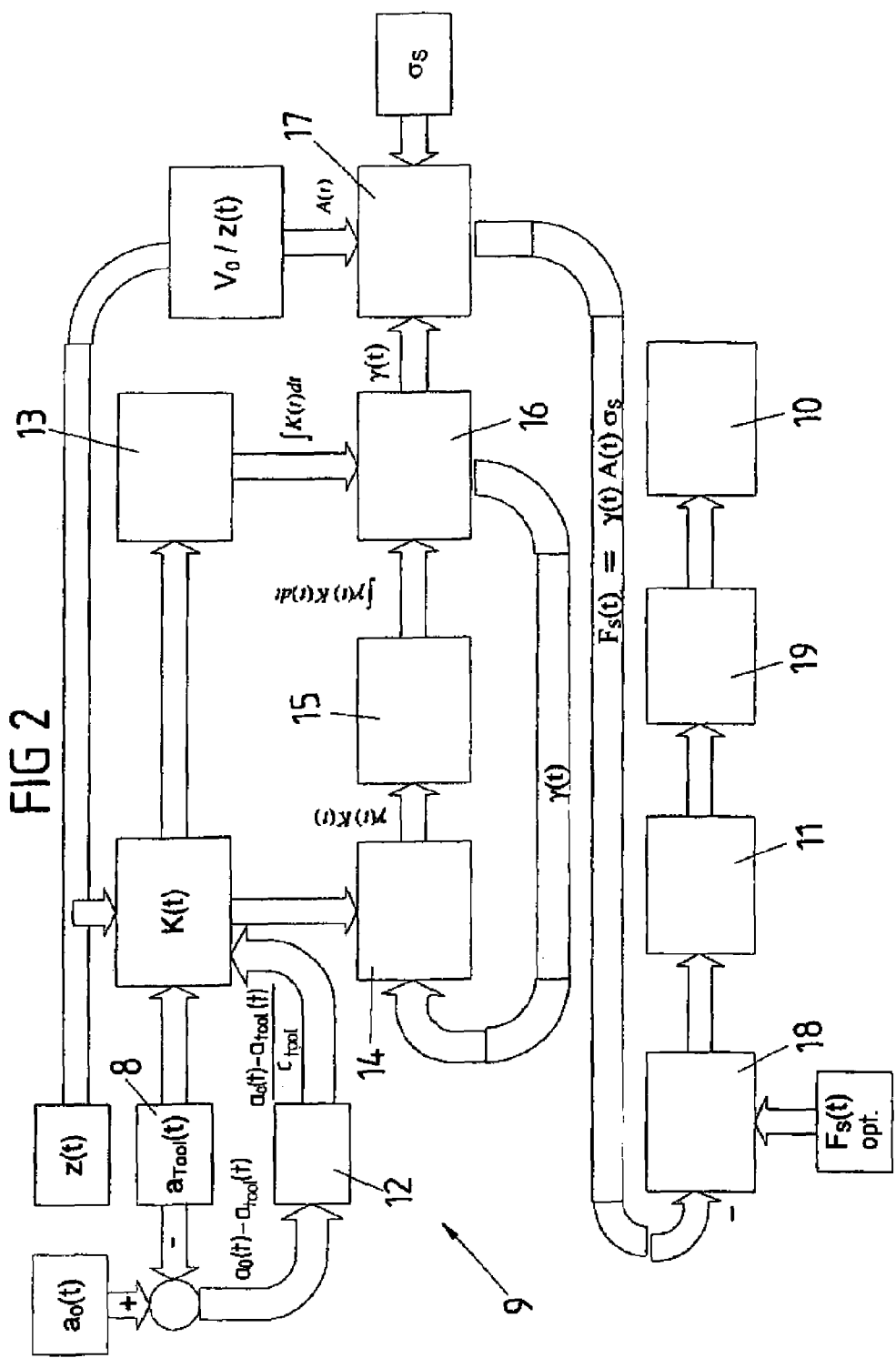
FIG. 2 schematically illustrates a method for generating wire bonds, wherein the vibration amplitude of a tool that is employed in order to press a first surface of a portion of a wire against a second surface of a pad like electrical contact member while at the same time vibrating the portion of the wire along the second surface so as to generate a bond between the portion of the wire and the electrical contact member is determined, as well as the deformation of the wire during the bonding process, and wherein these quantities are used in a feed back loop in order to optimize the quality of the generated bonds.

FIG. 2 shows a detailed block diagram of the analyzing device $9$ being connected to the measuring device $8$ and the transducer $10$. From the diagram one can infer the single operations that have to be performed by the analyzing device $9$ in order to determine the current shear force $F_s(t)$ and to control the bond generating process via adjustment of the transducer's $10$ ultrasonic power.

For each time $t_{bond}$ during the generation of a bond the analyzing device $9$ subtracts the vibration amplitude $a_{tool}(t)$ from the load free vibration amplitude $a_0(t)$, the result being amplified by means of an amplifier $12$ by a certain factor $1/c_{tool}$ incorporating the predetermined constants, and combined with the vibration amplitude $a_{tool}(t)$, and the height $z(t)$ of the portion $3a$ of the wire $3$, so as to yield the quantity $K(t)$. The latter quantity $K(t)$ is fed to a first multiplier $14$ as well as two a first Integrator $13$ that integrates $K(t)$ with respect to time which yields an estimate of $\gamma(t)$ that is multiplied by means of a first multiplier $14$ by $K(t)$ and integrated thereafter by means of a second integrator $15$ from which it is passed to an adder $16$. The latter loop allows for determination of the fraction $\gamma(t)$ of the bond surface $A(t)$ that is bonded to the second surface $S$ at time $t_{bond}$ which is then multiplied by means of a second multiplier $17$ with the factor $\sigma_s$, and the bond surface $A(t)$ determined from the height $z(t)$ and the Volume $V_0$ of the respective portion $3a$ of the wire $3$ for each considered time $t_{bond}$. This yields the shear force $F_s(t)$ at each considered time $t_{bond}$ during the bonding process.

From the second multiplier $17$ the shear force $F_s(t)$ is fed to the subtracter $18$ where the optimal shear force $F_{s,opt}(t)$ determined in beforehand is subtracted from the shear force $F_s(t)$ determined in situ. The result is routed to a PID controller $11$ of the analyzing device $9$ that adjusts the ultrasonic generator $10$—to which it is coupled via an 8 bit D/A converter $19$—so as to minimize the (absolute) difference between the online measured shear force $F_s(t)$ and the predetermined optimal shear force $F_{s,opt}(t)$.

Figure 3:
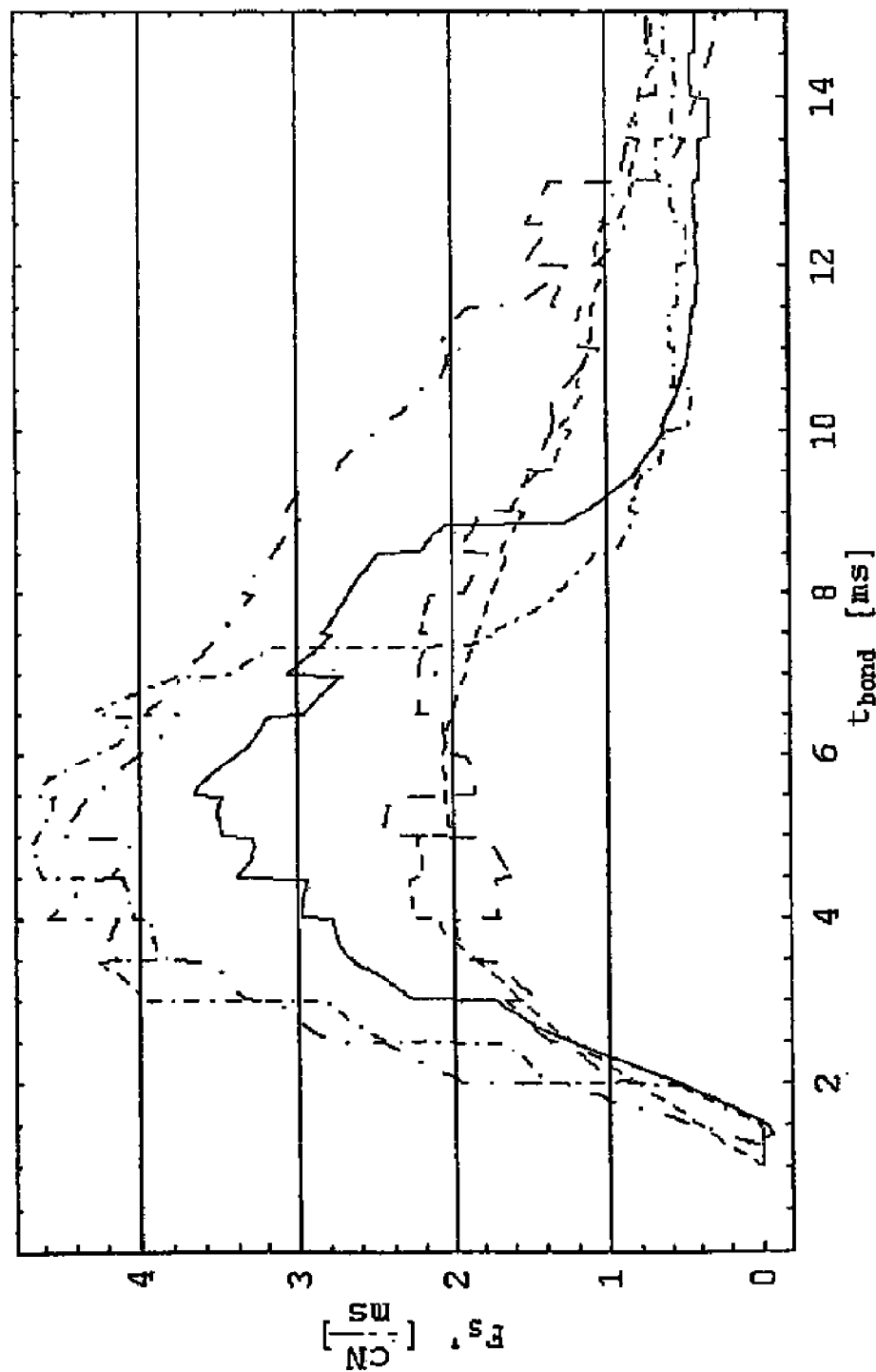
FIG. 3 shows the derivative of different shear forces with respect to the time lapsed during the formation of the bond compared to the derivative of an optimal shear force associated to an optimal bond.

FIG. 3 shows the derivative $F_s'(t)$ of the shear force $F_s(t)$ with respect to the time $t$ over the time $t$ (denoted as tbond) during the generation of the bond. The solid line represents the slope of the shear force $F_s(t)$ for an optimal pond process. The dot-dashed curves correspond to an over-bonded bond, whereas the dashed curves indicate under-bonding of the respective bond.

Figure 4:
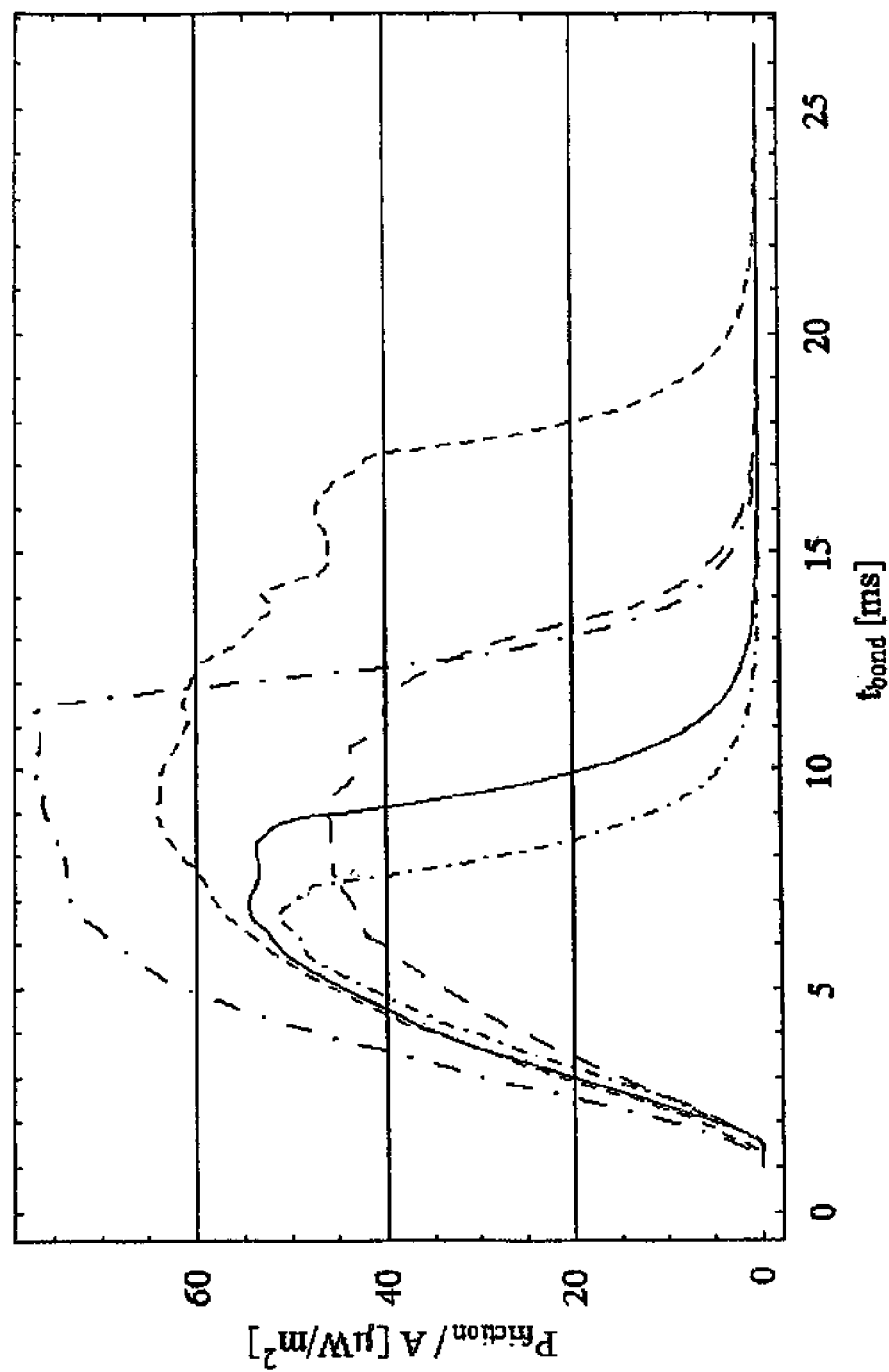
FIG. 4 shows the different friction powers as function of the time lapsed during formation of the bond.

FIG. 4 shows the frictional power per unit area, denoted as $P_{friction}$, which is due to the bond force $F_{nb}$ and the vibration applied to the portion $3a$ of the wire $3$. As can be seen from the plot, a too high/low bond force and ultrasonic power, respectively, is reflected in the friction power $P_{friction}$. Again the solid curve represents the optimum, whereas the dot-long-dashed curve corresponds to a too high ultrasonic power, the long-dashed curve corresponds to a too low ultrasonic power, the short-dashed curve corresponds to a too high bond force $F_{nb}$, and the dot-short-dashed line corresponds to a too low bond force $F_{nb}$.

The invention claimed is:

1. Method for generating a bond between a wire and an electrical contact member, comprising the steps of:
   pressing a first surface of a portion of the wire against a second surface of the electrical contact member with a first force while vibrating the portion of the wire along the second surface in order to generate a bond,
   determining the time dependent vibration amplitude of the portion of the wire during the generation of the bond,
   determining the time dependent deformation of said portion of the wire due to said applied first force and said vibration during the generation of the bond, and
   generating a time dependent first signal using at least said amplitude and said deformation during the generation of the bond that represents a minimal force that has to be applied to the bond along or across the second surface in order to physically break the bond at a considered time during generation of the bond, wherein an optimal first signal is determined before the generation of the bond, wherein the optimal first signal defines an optimal bond during generation of said optimal bond and at least one control parameter is adjusted during generation of the bond depending on the difference measured between said optimal first signal and said first signal during generation of the bond.

2. Method according to claim 1, wherein the at least one control parameter is adjusted so as to decrease the absolute value of the difference between the optimal first signal and the measured first signal during generation of the bond.

3. Method according to claim 2, wherein the control parameter is adjusted such that a minimum required first signal that is needed in order to form an optimal bond is achieved during generation of the bond.

4. Method according to claim 1, wherein the at least one control parameter is one of:
a vibrational energy per unit time,
a norm and/or direction of the first force.

5. Method according to claim 1, wherein, the time dependent first signal represents the minimal shear force that has to be applied to the bond in order to physically break the bond at a considered time during generation of the bond.

6. Method according to claim 1 the optimal first signal represents the minimal shear force that has to be applied to an optimal bond in order to physically break the optimal bond at a certain time during generation of said optimal bond.

7. Method according to claim 1, wherein the vibration amplitude of the portion of the wire is determined by measuring the corresponding vibration amplitude of a tool that is used for generating said vibration of said portion of the wire.

8. Method according to claim 7, wherein the vibration amplitude of the vibration of the tool is measured by means of a laser.

9. Method according to claim 7, wherein the vibration amplitude of the tool is measured under a predefined angle with respect to the direction of the first force.

10. Method according to claim 9, wherein the deformation of the portion of the wire is extracted from the vibration amplitude of the tool.

11. Method according to claim 7, wherein, the vibration amplitude of the tool is determined by means of one of an inductive sensor, an acceleration sensor, and a force sensor.

12. Method according to claim 1, wherein the generated bond is marked in case the difference between the optimal first signal and the first signal measured during generation of said bond surpasses a predefined value during generation of the bond, in order to automatically detect said marked bond among a group of generated bonds.

13. Method according to claim 12, wherein generated bonds are examined, wherein marked bonds are detected and repaired.

14. Method according to claim 2, wherein a frictional energy dissipated per unit time due to the interaction between the first surface of the portion of the wire and the second surface of the electrical contact member is measured during generation of the bond for controlling the at least one control parameter.

15. Method according to claim 2, wherein a time dependent deformation energy for achieving the deformation of the portion of the wire is measured during generation of said bond for controlling the at least one control parameter during generation of the bond.

16. Method according to claim 1, wherein a frictional energy dissipated per unit time due to the interaction between the wire and the second surface of the electrical contact member is measured during generation of said bond for determining a temperature dependent parameter characterizing the temperature dependency of the bond forming process.

17. Method according to claim 16, wherein the parameter is one of a flow stress of the wire, a flow stress of the electrical contact member, an interatomic connection of the wire, and an interatomic connection of the electrical contact member.

18. Method according to claim 2, wherein a second force being exerted by the tool via the portion of the wire on the second surface of the electrical contact member, wherein the second force is directed along the second surface, is measured during generation of the bond for controlling the at least one control parameter during generation of the bond.

19. A method according to claim 1, wherein said minimal force is the minimal sheer force that has to be applied to the bond along or across the second surface in order to physically break the bond at a considered time during generation of the bond.

* * * * *